United States Patent [19]

Bates, Jr.

[11] Patent Number: 5,170,125
[45] Date of Patent: Dec. 8, 1992

[54] TESTER FOR THE IGNITION MODULE OF A VEHICLE

[76] Inventor: James F. Bates, Jr., 552 Newport Ave., Fond du Lac, Wis. 54335-3111

[21] Appl. No.: 872,022

[22] Filed: Apr. 22, 1992

[51] Int. Cl.5 .................... G01R 31/02; G01M 19/00
[52] U.S. Cl. .................................. 324/537; 73/118.1; 324/556
[58] Field of Search ............... 324/537, 555, 133, 556; 340/657, 664; 73/118.1

[56] References Cited

U.S. PATENT DOCUMENTS

| | | | |
|---|---|---|---|
| Re. 33,692 | 9/1991 | Hirano et al. | 324/537 |
| 424,307 | 12/1880 | Hong | 324/555 |
| 4,673,868 | 6/1987 | Jones, Jr. | 324/545 |
| 4,894,648 | 1/1990 | Talbot | 324/537 |

*Primary Examiner*—Jack B. Harvey
*Assistant Examiner*—Maura K. Regan
*Attorney, Agent, or Firm*—Fuller, Ryan, Hohenfeldt & Kees

[57] ABSTRACT

A tester is adapted to plug in or otherwise connect to an ignition control module under test. The tester includes an LED in series with a resistor. The series circuit is connected between a battery and a contact in the connector which provides the control module with an electric load in substitution for the ignition coil primary associated with the vehicle engine. If, after the tester is connected to the ignition control module and to a battery, the LED is turned on bright, it is one indication of a failed switching transistor in the module. The tester is provided with a flexible lead terminating in a contact which is touched to a predetermined terminal of the ignition control module. If the LED flashes on and off in correspondence with the terminal being touched, it is an indication of the control module being capable of processing ignition timing signals and of the switching transistor in the module being good.

8 Claims, 1 Drawing Sheet

TESTER FOR THE IGNITION MODULE OF A VEHICLE

BACKGROUND OF THE INVENTION

The invention disclosed herein is a device for determining if the ignition control module used in substantially all modern vehicles is operative to send current pulses to the primary of the engine ignition coil for starting and running the engine.

As is well known, modern automobiles have an onboard computer that sends signals to an ignition control module in which there is a transistor switch that closes the circuit to the primary of the ignition coil at the moment the spark plugs are supposed to fire. During normal engine operation, the computer may have data inputs representative of instantaneous barometric pressure, manifold vacuum level, coolant temperature, mass air flow, engine speed, and so forth. These data are used by the computer to calculate the exact instant at which the ignition spark timing signal should be sent to the ignition control module. The spark timing signal is coupled to the primary of the ignition coil through the transistor switch in the ignition control module. The transistor switch sometimes fails within itself and at other times fails to function as a result of defects in other parts of the circuitry within the ignition control module. If the transistor switch does not turn on and off in response to ignition timing signals, the engine cannot possibly start. If the engine does not start, the vehicle owner ordinarily does not have an indication as to why it does not start. Usually, however, if the transistor switch is not defective, the engine will start and any problems in engine operation must be searched for elsewhere. That is why it is important and desirable to have available an inexpensive and easy to use device for testing operability of the ignition control module as to its capability for processing an ignition timing signal from the computer and for determining if the transistor switch is operative.

SUMMARY OF THE INVENTION

An objective of the invention is to provide a tester which can be used to test the operability of the ignition control module.

Another objective of the invention is to provide do-it-yourself mechanics and small automobile service shops with an inexpensive and easy to use device for testing the ignition control module so as to obviate the need for investing in the costly and sophisticated diagnostic equipment which is used in full service automobile repair shops. Moreover, testing the ignition control module with the tester disclosed herein can be done without requiring any special skill and can save the amateur mechanic the time and expense of putting the vehicle in a service shop when only replacement of the module is required.

According to the invention, a device is provided that has an LED (light emitting diode) connected in a series circuit with a current limiting resistor. This circuit along with some other circuitry residing in the unitary device is provided with means for making appropriate connections to the ignition control module under test. Testing with the new device simply involves periodically contacting a predetermined terminal of the ignition control module with the end of a lead wire that extends from the tester. If the LED flashes on at the time of touching and off when contact is discontinued, it is an indication that the transistor switch in the module is functioning properly and that the module has the capability of processing ignition timing signals. The test involves no loading of the computer nor is there any possibility of damaging a good control module because the module under test is not subjected to a voltage any higher than that which is normally derived from the battery of the vehicle.

How the foregoing and other objects of the invention are achieved will be evident in the ensuing more detailed description of embodiments of the invention which will now be set forth in reference to the drawing.

DESCRIPTION OF A PREFERRED EMBODIMENT

Figure 1:
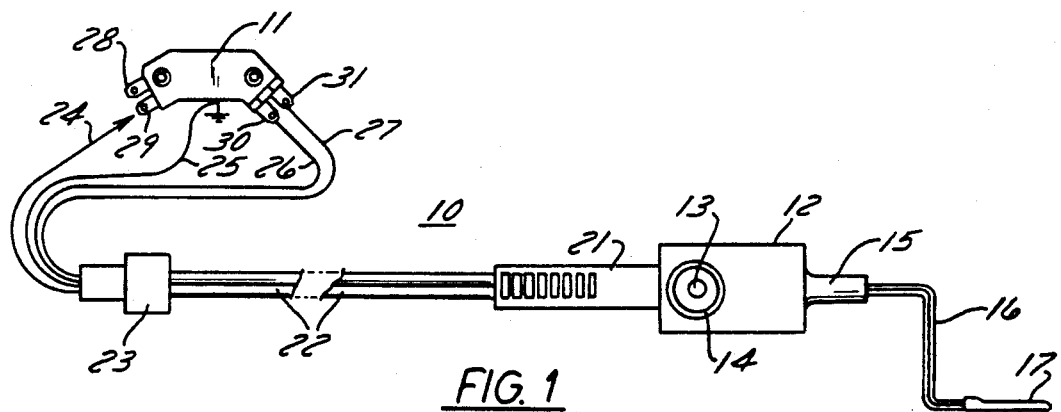
FIG. 1 depicts the new ignition control module tester with its leads connected to an ignition control module used in the vehicles of some manufacturers.

In FIG. 1, the new tester is designated generally by the reference numeral 10 and the ignition control module under test is marked 11. The tester is comprised of an insulating body 12. An LED 13 can be visualized from outside of body 12. A cylindrical or tubular element 14 extends from the surface of body 12 and surrounds LED 13 to shade it from ambient light and protect it. A strain relief 15 is molded integrally with body 12 and it has a two conductor cord 16 extending from it. Cord 16 terminates in a connector 17 for connecting the two conductors to the terminals of a battery 18. Another strain relief 21 extends from body 12. There are three conductors within a flexible sleeve 22 extending from strain relief 21. The conductors extend into element 23 from which the conductors continue for being temporarily connected to the ignition control module 11 for testing purposes. Four leads come out of element 23. They are marked 24, 25, 26 and 27. The spade connectors of the module 11 are marked 28, 29, 30 and 31.

The computer on the vehicle is not illustrated because it is not involved in testing the ignition control module. It will be understood, however, that other control and ignition system components are present on the automobile as is well known to those who are familiar with modern automobiles Although these components are not shown, they will include a distributor having a pickup device which signals the engine crankshaft position to the computer so the computer can determine when to signal the ignition control module to couple the current signal to the primary of the distributor when a spark plug is supposed to fire. Some distributors contain a magnetic pickup device which, as a result of its peripheral iron teeth rotating past a pickup coil, will induce signals in the coil corresponding to the time at which a spark plug should be fired. Other distributors may use a Hall Effect pickup device as is well known.

The ignition control module contains an integrated circuit, other electronic components and the transistor switch, none of which are visible in the module. The ignition coil, not shown, is conventional. The high voltage developed by the ignition coil is conducted to the central connection of a distributor cap as is conventional. Typically, one terminal of the ignition control module connects to a terminal of the primary winding of the ignition coil and another terminal of the coil connects to the battery through a ground circuit The familiar ignition key switch, not shown, is in this circuit.

Figure 2:
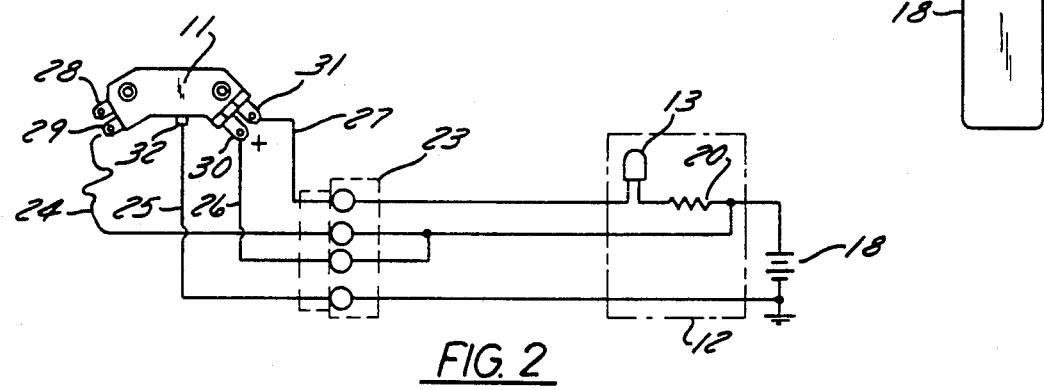
FIG. 2 is a circuit diagram of the tester depicted in FIG. 1.

FIG. 2 shows the circuit diagram of the new ignition control module tester. The tester is presently connected to ignition control module 11 for testing it. When the ignition control module 11 is connected for normal operation of the engine, the terminal represented by spade connector 31 is connected to one terminal of the ignition coil primary, not shown. Spade connector terminal 30 of the module connects directly to the battery 18. Spade connector 32 terminal connects directly to the negative side of the battery or ground. Spade connector 29 terminal receives ignition timing signals from the computer during normal engine operation. The signal derived from lead 24 resulting from touching it to spade connector 29 substitutes for the timing input signal during module 11 testing Spade connector 28 is not involved in the testing procedure.

If the module is being tested on the vehicle, terminal 30 in FIG. 2 will be connected to the vehicle battery LED 13 has a current limiting resistor 20 connected in series with it. In FIG. 2, the test is about to start for determining if the switching transistor of the ignition module is capable of triggering and if the ignition modules pickup signal input and ignition coil firing circuits are working. If the ignition module tests good, it should be capable of starting the vehicle when it is reconnected into the vehicle circuitry. When the leads 25-27 are connected as depicted in FIG. 2 at the start of the testing procedure, the LED 13 should not be illuminated. If the LED turns on and stays on, the ignition module is defective and needs to be replaced. Assuming that this has not happened, testing continues by touching the tip of lead wire 24 to a predetermined terminal of the module which in this case is the ignition triggering terminal 29 of the module. Each time the tip of lead wire 24 is touched to spade terminal 29, LED 13 should flash on. If the LED fails to turn on while contact is being made with terminal 29, the ignition module is defective and needs to be replaced. Disconnecting lead wire 24 from spade connector 29 should result in the LED turning off. That is all there is to testing the type of ignition module 11 depicted in FIG. 2 with the new tester.

Figure 3:
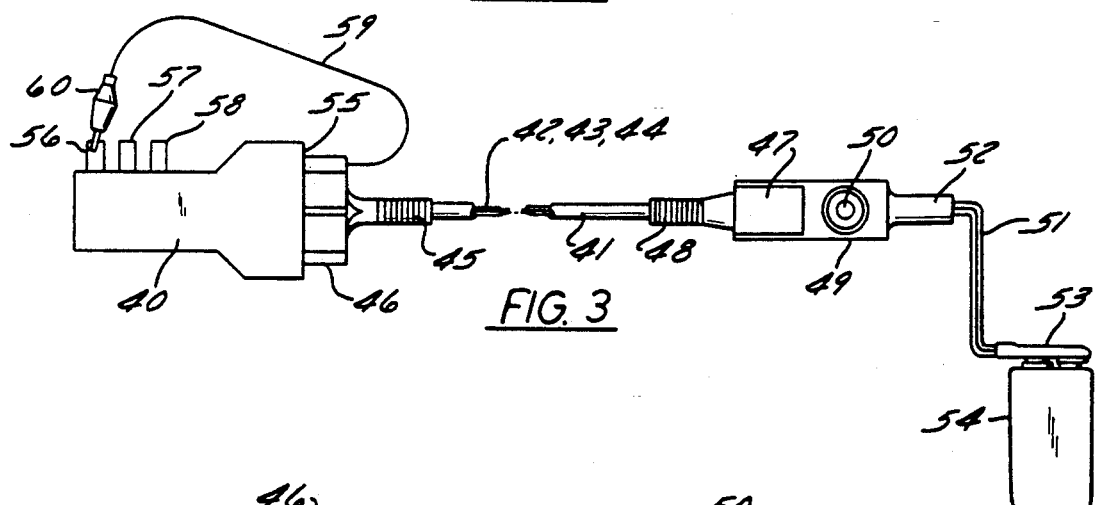
FIG. 3 depicts a somewhat modified embodiment of the new tester adapted for testing another type of ignition control module when the new testing device is plugged into it as it is in this figure.

FIG. 3 shows another ignition module 40 configuration. This module is patterned after the Ford Motor Co. TFI ignition module. The new tester comprises an insulating sleeve 41 in which there are three conductors 42, 43 and 44 as is indicated by breaking away the flexible insulating sleeve 41. The three conductors pass through a flexible strain relief portion 45 and terminate in a connector body 46 that serves as a plug. Another plug 47 is presently coupled to a connector body 49 that is composed of an insulating material. Within body 49 there is an LED 50 which can be visualized from outside of the body 49. A two conductor cord 51 runs out of a strain relief flexible member 52 associated with body 49. The two conductor cord 51 terminates in a connector 53 which provides for connecting to a battery 54. The ignition control module 40 has a recess at its one end 55 to provide for inserting plug 46 of the new tester. The module 40 has three exposed terminals in the form of spade connectors 56, 57 and 58. A single lead 59 extends from plug 46 and terminates in an alligator clip 60 or any other element that can provide a bare electrical contacting surface. The clip is presently shown as momentarily contacting spade connector 56. The tester in FIG. 3 is presently set up for determining if the switching transistor, not shown, in the module is good and if the module has the capability of properly processing the ignition timing signal.

Figure 4:
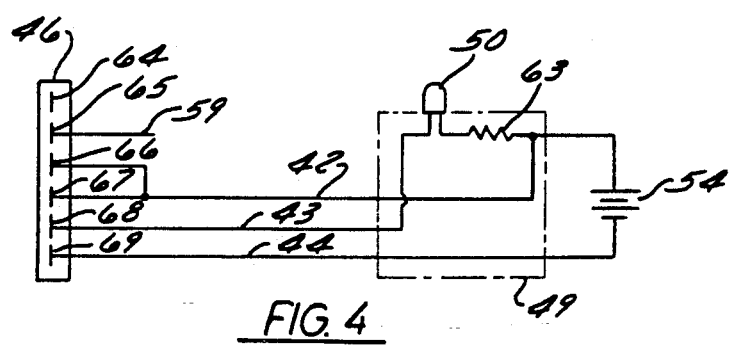
FIG. 4 is a circuit diagram of the embodiment of the tester depicted in FIG. 3.

FIG. 4 depicts the circuit diagram for the new tester. Plug 46 is symbolized by a rectangle. The LED 50 is connected in a series circuit with a current limiting resistor 63 that is mounted inside of body 49. The series connected resistor 63 and LED 50 are in a circuit which runs from the positive terminal of battery 54 to a connector pin 68 in connector 46 of the tester The positive voltage from battery 54 is applied directly to connector pins 66 and 67 by way of a lead 42. The series circuit comprised of LED 50 and resistor 63 is connected on one side to battery 54 and on the other side, by way of a lead wire 43 to a pin or contact 68 in plug 46 of the new tester The connector pin, not visible, in module 40 to which the pin 68 connects for running a test is ordinarily connected to the primary of the ignition coil, not shown. It will be evident from inspection of the circuit that the LED 50 constitutes an electrical load circuit which substitutes for the ignition coil during the test. In connector 46, pin or contact 66 is one that plugs into the B+start terminal, not visible, of the module. Pin or contact 67 of the connector plugs into the B+ run terminal, not visible, of the module. Pin or contact 69 of connector 46 is connected to the negative side of the battery and ground. Flexible test lead 59 is connected to pin or contact 65 of connector 46. This contact ordinarily would connect with a mating contact, not visible, in the module which receives the timing signal from the computer during normal operation. In the test mode, contact 65 for test lead 59 connects to ground. During regular engine operation contact 65 receives from the computer a signal to fire the ignition coil primary. This signal pulls contact 65 to low potential. Hence, to test this module connecting contact 65 to ground by way of lead 59 simulates pulling contact 65 low. Contact 64 of connector 46, ordinarily receives the pickup signal from the distributor of the engine, not shown, and this signal is ordinarily transmitted to the computer as is known to those who are familiar with modern ignition systems.

It should be appreciated, however, that the testers described herein are especially beneficial to mechanics who desire to maintain their own vehicles. All the do-it-yourself mechanic has to do is plug in the connector 46 of the tester into the ignition control module. In the case of the FIG. 1 embodiment, the person using the new tester simply has to make connections to some exposed terminals on the ignition control module 11. Little skill is required to correctly use the tester Flashing information as to the condition of the switching transistor in the module and the capability of the module to process ignition timing signals is determined simply by observing the flashing or lack of flashing of LED 50.

A test of module 40 in FIG. 3 can proceed with the set up in FIG. 3. All circuitry is energized from battery 54. When the tester is plugged into the module 40, LED 50 should be almost extinguished or completely off. If the test unit LED 50 is bright, the ignition module is defective and needs to be replaced. The bright LED is likely to be an indication that the switching transistor in the module is shorted to ground. If the LED 50 is turned off at the outset, the test proceeds by touching the tip of the alligator clip 60 to the predetermined spade connector terminal 56 on the module. If the module is good, LED 50 should flash brightly each time the bare tip of alligator clip 60 of the lead 59 contacts terminal 56. If the LED fails to flash, the ignition model is defective and should be replaced. That is all there is to the test.

Thus, a simple and inexpensive testing device has accomplished what might be otherwise necessary to accomplish by delivering the vehicle to the service department of a garage where costly professional testing equipment is in regular use. The testers described herein are versatile in that they can test a variety of ignition control modules. By way of example, and not limitation, they can test or be readily adapted to connect to and test General Motors 4, 5 and 7 pin modules, Ford 3 pin magnetic ignition modules, Ford grommet style ignition modules, Chrysler 4 and 5 pin modules and GM "Shrouded" (8 pin modules).

Although embodiments of the new tester have been described in detail, such description is intended to be illustrative rather than limiting, for the invention may be variously embodied and is to be limited only by interpretation of the claims which follow.

I claim:

1. A device for testing the ignition control module of a motor vehicle, comprising:
    a member including an LED and a resistor connected in a series circuit,
    a conductor for connecting one end of the series circuit to a battery terminal of one polarity and a conductor for connecting the other end of the series circuit to a predetermined terminal of the ignition control module undergoing a test,
    a conductor for connecting one of its ends to a terminal of said battery having a polarity opposite of the one polarity and also at ground potential and for connecting the other of its ends to another terminal of the ignition control module, and
    a conductor for making a connection between said battery terminal of one polarity and another terminal of said ignition control module.

2. The device according to claim 1 including a conductive lead that is movable during testing the ignition control module to provide for manually putting the end of the lead in and out of electrical contact with a predetermined terminal of said ignition control module such that said LED flashes on and off, respectively, if said control module under test is good.

3. The device according to claim 2 wherein said conductors extend from said member containing the LED and resistor, and an adapter into which said conductors extend, said conductors, respectively, being extended from said adapter with flexible leads for connecting to predetermined terminals, respectively, on the ignition control module under test.

4. The device according to claim 2 wherein said conductors extend from said member containing the LED and resistor, and
    a connector plug having a plurality of contacts to which said conductors, respectively, connect one of the contacts in said plug that connects to ground, when said plug is connected to said control module for testing, having a flexible conductive lead connected to it, said lead providing for having its end put manually in and out of contact with a predetermined terminal of said ignition control module such that said LED flashes on and off, respectively, if said control module under test is good.

5. A method of testing an ignition control module of a vehicle to determine if a switching transistor contained therein is good and to determine if said module is capable of responding correctly to ignition timing signals reclined from a computer aboard the vehicle, comprising the steps of:
    connecting one end of a circuit comprised of an LED in series with a resistor by means of a first conductor to a battery terminal of one polarity and connecting the other end of said circuit by means of a second conductor to a predetermined terminal on said ignition control module,
    connecting one end of a third conductor to a battery terminal whose polarity is opposite of said one polarity and connecting the opposite end of said third conductor to the ground terminal of said ignition control module,
    connecting a fourth conductor to said battery terminal of one polarity and to another predetermined terminal of said ignition control module, and having a flexible conductive lead in electrical continuity with said fourth conductor such that the other end of the lead is adapted for being put manually in and out of electrical contact with a predetermined test terminal of said ignition control module such that if the LED flashes on and off, respectively, the switching transistor is testing good and the flashing indicates that the ignition control module is capable of processing ignition timing signals.

6. The method according to claim 5 wherein if said LED turns on and stays on before said contact to said terminal is made, the module is indicated to be defective.

7. A method of testing an ignition control module of a vehicle to determine if a switching transistor contained therein is good and to determine if said module is capable of responding correctly to ignition timing signals from the computer aboard the vehicle, comprising the steps of:
    connecting one end of a circuit comprised of an LED in series with a resistor by means of a first conductor to a battery terminal of one polarity and having the other end of the circuit connected by means of a second conductor to a contact in a connector plug,
    connecting one end of a third conductor to a battery terminal whose polarity is opposite of said one polarity and having the other end of the third conductor connected to another contact in the connected plug,
    connecting one end of a fourth conductor to said battery terminal of one polarity and connecting the other end to two separate predetermined contacts in said connector plug,
    having a flexible lead extending from said plug which lead is connected to a contact in said plug that connects to ground when said plug is plugged into said ignition control module, said lead providing for putting it into and out of electrical contact with a predetermined terminal on the ignition control module such that if the LED flashes on and off, respectively, when said lead is contacted and removed from said terminal the switching transistor is testing good and the flashing indicates that the control module is capable of processing ignition timing signals.

8. The method according to claim 7 wherein if said LED turns on and stays on when before contact of said lead to said predetermined terminal is made, the module is indicated to be defective.

* * * * *